(12) United States Patent
Shin et al.

(10) Patent No.: US 9,502,393 B2
(45) Date of Patent: Nov. 22, 2016

(54) DISPLAY DEVICE AND METHOD FOR MANUFACTURING THE SAME

(71) Applicant: LG DISPLAY CO., LTD., Seoul (KR)

(72) Inventors: Mihee Shin, Goyang-si (KR); Hun Jeoung, Paju-si (KR); Mingyeong Kim, Gunpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/838,568

(22) Filed: Aug. 28, 2015

(65) Prior Publication Data

US 2016/0064364 A1 Mar. 3, 2016

(30) Foreign Application Priority Data

Aug. 29, 2014 (KR) ........................ 10-2014-0114607

(51) Int. Cl.
*H01L 29/18* (2006.01)
*H01L 25/16* (2006.01)
*G02F 1/13* (2006.01)
*G02F 1/1345* (2006.01)
*G02F 1/1362* (2006.01)
*G09G 3/00* (2006.01)
*H01L 23/00* (2006.01)
*H01L 25/00* (2006.01)

(52) U.S. Cl.
CPC ........... *H01L 25/167* (2013.01); *G02F 1/1309* (2013.01); *G02F 1/13454* (2013.01); *G02F 1/136204* (2013.01); *G09G 3/006* (2013.01); *H01L 23/564* (2013.01); *H01L 25/50* (2013.01); *G02F 2001/136254* (2013.01); *G09G 2300/043* (2013.01); *G09G 2300/0408* (2013.01); *G09G 2300/0426* (2013.01); *H01L 2924/0002* (2013.01)

(58) Field of Classification Search
CPC ........... H01L 27/3244; H01L 27/3246; H01L 27/3248; H01L 27/3253; H01L 27/3276; H01L 27/3288
USPC .............................................. 257/59, 60, 64
See application file for complete search history.

(56) References Cited

U.S. PATENT DOCUMENTS

2008/0048708 A1 2/2008 Hsu
2009/0294771 A1* 12/2009 Kim ................. G02F 1/136204
 257/59
2010/0006838 A1 1/2010 Yoshida et al.
2013/0265072 A1* 10/2013 Kim ...................... G09G 3/006
 324/754.01

* cited by examiner

*Primary Examiner* — Brook Kebede
(74) *Attorney, Agent, or Firm* — Dentons US LLP

(57) ABSTRACT

Disclosed is a display device including features that suppresses threshold voltage variation among the oxide thin-film transistors of an array substrate and a method for manufacturing the same. The display device includes a first COG block including sub-pixels configured to receive an output signal from a first drive integrated circuit positioned in a first COG area; a second COG block including sub-pixels configured to receive an output signal from a second drive integrated circuit positioned in a second COG area; and an equipotential line extended from the first COG area to the second COG area.

21 Claims, 9 Drawing Sheets

DISPLAY DEVICE AND METHOD FOR MANUFACTURING THE SAME

CROSS-REFERENCE TO RELATED APPLICATIONS

This application claims the priority of Korean Patent Application No. 10-2014-0114607 filed on Aug. 29, 2014, in the Korean Intellectual Property Office, the disclosure of which is incorporated herein by reference for all purposes as if fully set forth herein.

BACKGROUND OF THE INVENTION

Field of the Invention

The present disclosure relates to a display device. More particularly, the disclosure related to a display device which adopts a design for suppressing occurrence of problems caused by electrostatic charge generated during manufacturing and/or testing of the display device, and a method for manufacturing the same.

Description of the Related Art

Electronic devices employ various types of flat panel displays, including but not limited to, a liquid crystal display, a plasma display, a field emission display, an electrophoretic display and an organic light emitting diode display to present visual information.

A display device is configured to convert an image signal input from the outside into a data voltage and display an image on a plurality of pixels in response to the image signal depending on the data voltage. Such a display device includes a substrate on which a circuit including a thin film transistor (TFT), a line, and pads connected with drive integrated circuits (D-ICs) for driving the display device is formed. Such a substrate is called an "array substrate" or a "backplane".

Electric charge (electrostatic) may be generated while carrying out various processes for manufacturing the array substrate of the display device. For example, High-Pressure Micro Jet (HPMJ) or triboelectrification processes can cause electric charges to build up on or around the array substrate. A dry etching process and various other patterning processes can also generate electrostatics charges, which may be introduced to the array substrate through various routes. The electrostatic charges introduced to the array substrate may be trapped in various organic/inorganic layers in the display device, and affect electrical properties of various components of the array substrate such as the thin-film-transistors, resulting in display defects.

Such a problem is particularly difficult to deal with if the active area of the display device is divided into a plurality of chip-on-glass (COG) blocks, in which each of the COG blocks are driven by a discrete drive integrated circuit (D-IC) or a discrete set of drive integrated circuits. As the amount of trapped electric charges is different at different parts of the organic/inorganic layers, some COG blocks may be more heavily affected by the trapped electric charges than other COG blocks, creating electrical property differences between the COG blocks. Such differences of electrical properties between the COG blocks can result in visual differences between the parts of an image rendered by different COG blocks.

In order to improve such defects, various additional processes may be performed. For example, as for an array substrate implemented with a thin-film transistor (TFT) that uses a silicon semiconductor as an active layer, additional processes for doping a hole or a plasma process may be further performed in order to recover or otherwise improve the electrical properties of the TFT. On the contrary, additional processes for recovering or improving the electrical properties are limited for an array substrate implemented with oxide semiconductor transistor. For instance, doping the oxide semiconductor of the TFTs for closing the gap between the threshold voltages of the TFTs in different COG blocks might require shifting the threshold voltage to an undesired level. Further, high temperature processes may cause oxygen vacancies in the oxide semiconductor. Accordingly, a new structural design is needed for minimizing electrical and visual differences between the COG blocks resulting from electrostatic charges introduced during a manufacturing process of the display device.

SUMMARY

Accordingly, an object of the present disclosure is to provide a display device which adopts a new structure for solving defects of the display device caused by electrical charges introduced to the display device during a manufacturing process and a testing process of the display device, and a method for manufacturing the display device.

A display device of the present disclosure includes an active area having sub-pixels, which can be implemented with liquid crystal, organic light emitting diodes or any other elements that can collectively display an image. The sub-pixels of the display device are configured to receive signals, for example gate signals for switching the TFTs on, from the plurality of drive integrated circuits (D-ICs) mounted in the inactive area of the display device. The D-ICs are directly mounted on the substrate of the display device in a manner referred to as the chip-on-glass (COG), and each of the D-ICs is placed at a different location (i.e., COG area) from one another. Each D-IC is configured to supply signals on a discrete set of conductive lines linked to a certain set of sub-pixels, thereby forming a COG block.

As such, the display device includes a plurality of COG blocks, in which each COG block is provided with a set of sub-pixels configured to receive signals output from at least one D-IC dedicated for that COG block. For example, the plurality of D-ICs can be gate D-ICs for supplying gate signals on a set of gate lines to control the sub-pixels connected thereto. Here, the sub-pixels of the first COG block receive gate signals from the first D-IC and the sub-pixels of the second COG block receive gate signals from the second D-IC.

During manufacturing of the display device, the COG blocks are electrically connected with each other by one or more equipotential lines, so that equipotential is formed between the components of the linked COG blocks. That is, the gate lines as well as the TFTs controlled by the gate lines of different COG blocks are electrically linked to each other by the equipotential lines. In this way, all of the COG blocks linked by the equipotential line would be affected at a similar level by the electrostatic charges generated during manufacturing of the display device. Reducing the differences between the electrical properties among the COG blocks expands the number of options that can be taken to recover or otherwise manage the electrical characteristics of the components to a desired level.

After performing various processes, which might be accompanied by the undesired electrical charges, the equipotential lines can be cut so that the gate lines and the TFTs of a COG block are electrically disconnected from the gate lines and the TFTs of other COG blocks. For example, the equipotential line forming equipotential among the COG blocks can be cut prior to carrying out a manufacturing process or a testing process that requires providing signals to certain selective COG block(s).

In an exemplary embodiment of the present disclosure, a display device includes: a first COG block including sub-pixels configured to receive output signals from a first drive integrated circuit positioned in a first COG area; a second COG block including sub-pixels configured to receive output signals from a second drive integrated circuit positioned in a second COG area; and an equipotential line extended from the first COG area to the second COG area. In each of the first COG area and the second COG area, a plurality of input pads and a plurality of output pads are positioned so as to be connected with the drive integrated circuit (D-IC). Further, a shorting bar and a set of shorting lines extending out from the shorting bar are placed in each of the first COG area and the second COG area. The set of shorting lines includes shorting lines extending between the shorting bar and the output pads of the respective COG area. The set of shorting lines also include a shorting line extended between the shorting bar and the equipotential line. The shorting lines extending between the shorting bar and the plurality of output pads are removed along a trimming line so that the shorting bar is electrically disconnected from the plurality of output pads in the respective COG area. Similarly, the shorting line between the shorting bar and the equipotential line is removed along the trimming line so that the shorting bar is electrically disconnected from the equipotential line. As such, the equipotential line is electrically disconnected from the shorting bar of the first COG area and from the shorting bar of the second COG area.

The equipotential line extended between the first COG area and the second COG area may be in contact with at least one of the pads in the first COG area and at least one of the pads in the second COG area. In such cases, the set of shorting lines in each of the COG area includes a shorting line extended between the shorting bar and the pad that in contact with the equipotential line, which is cut at the portion corresponding to the trimming line.

In some embodiments, the pad in contact with the end of the equipotential line may be the input pad configured to input an external signal to the drive integrated circuit (D-IC) mounted in each COG area. In some embodiments, the pad in contact with the end of the equipotential line may be the output pad configured to output a signal from the drive integrated circuit (D-IC). Further, the pad in contact with the end of the equipotential line may be common electrode pads configured to apply a common voltage between each of the COG blocks. In some other embodiments, the pad in contact with the both ends of the equipotential line may be dummy pad other than the input pad, the output pad and the common electrode pad.

After the equipotential line is electrically disconnected from the shorting bars in the COG areas, the equipotential line may function as a conductive line for applying external input signals to the first drive integrated circuit (D-IC) and the second drive integrated circuit (D-IC). For instance, the equipotential line may also serve as a conductive line for applying a common voltage signal to the first and the second drive integrated circuits (D-ICs), or to transmit the common voltage signal between the drive integrated circuits (D-ICs). Further, in some embodiments, the equipotential line may be in a floating state once it is disconnected from the shorting bars of the COG areas.

In an exemplary embodiment of the present disclosure, a display device includes: a plurality of COG areas positioned along at least one side of a display panel; and an equipotential line extended to the plurality of COG areas. Each of the COG areas is provided with one or more input pads and one or more output pads that are connected with a drive integrated circuit. Each of the COG areas is also provided with a shorting bar. The equipotential line is in contact with the shorting bar in each of the COG areas.

The shorting bar positioned in each of the COG areas may be electrically insulated, or otherwise disconnected, from the output pad(s) positioned in the corresponding COG area. In this regard, the shorting bar may be disconnected from the output pad(s) by a laser trimming line. In other words, a part of the shorting lines between the shorting bar and the output pads, which corresponds to the laser trimming line, is removed so that the output pad(s) are electrically disconnected from the shorting bar in the respective COG area.

The equipotential line may be in contact with at least one of the pads excluding the output pads positioned in each of the COG areas. The pad in contact with a conductive line in each of the COG areas may be one of the input pad configured to input an external input signal to the drive integrated circuit (D-IC) mounted in the corresponding COG area, a dummy pad in a floating state, or a common electrode pad configured to transfer a common voltage.

In some embodiments, the equipotential line may be a conductive line connected to one or more input pads positioned in each of the COG areas and configured to supply one or more kinds of external input signals to the drive integrated circuit mounted in the COG areas. In this regard, a conductive line extending along an edge of the substrate may be used as the equipotential line during manufacturing of the display device. As such, the COG areas may be positioned closer to the active area of the display device than the conductive line that serves as the equipotential line.

In an exemplary embodiment of the present disclosure, a display device includes a plurality of drive integrated circuits (D-ICs), in which each D-IC is mounted in a discrete COG area. In each COG area, a D-IC is connected to one or more input pads and one or more output pads. Also provided in each of the COG areas is a shorting bar, which is positioned between the input pads and the output pads in the respective COG area. The shorting bar is electrically disconnected from the output pads. In this regard, conductive lines extended between the shorting bar and the output pads are cut along a trimming line. The display device further includes an equipotential line routed between at least two of the plurality of COG areas. The equipotential line is disconnected from the shorting bars provided in the COG areas. In this regard, a conductive line extended between the equipotential line and the shorting bar of the COG area is cut along the trimming line. During manufacturing of the display device, a laser trimming is performed along the trimming line in the COG areas. In each COG area, the trimming line may be in the form of a straight line running across the conductive lines extended between the shorting bar and the output pads and between the shorting bar and the equipotential line. Accordingly, in the display device, a portion of each of those conductive lines corresponding to the trimming line is physically removed. The size of the removed portion in each of the conductive lines depends on the width of the trimming line.

The present disclosure also relates to a method for manufacturing a display device which is driven as being divided into a plurality of COG blocks. According to an exemplary embodiment of the present disclosure, the method for manufacturing a display device includes: forming a plurality of COG areas and one or more equipotential lines on a substrate, in which each of the COG areas is provided with a plurality of input pads and a plurality of output pads configured to mount a drive integrated chip (D-IC). In each of the COG areas, a shorting bar is formed between the input pads and the output pads, and one or more shorting lines are formed to connect the shorting bar to the output pads and to the equipotential line. The equipotential line is formed so as to be in contact with the shorting bars in the COG areas, creating equipotential between at least two COG blocks. The method further includes a step for performing a laser trimming process along a laser trimming line that runs across the shorting lines, thereby cutting the shorting lines between the shorting bar and the output pads as well as the shorting line between the shorting bar and the equipotential line in the COG areas. The above-described pads, shorting bar, and equipotential line may be formed of the same material on the same layer on the substrate.

Accordingly, equipotential is maintained, not just on an individual COG block basis, but at a much greater scale; i.e., equipotential among the COG blocks of the display device. Until the laser trimming process for breaking the equipotential is performed, any effects from the electrostatic charges or the electrical charges trapped in the insulation layers of the display device will be distributed among the COG blocks. This enables to reduce the differences in electrical properties of the thin film transistors among the COG blocks of the display device.

In addition to the above-described aspects of the present disclosure, other features and advantages of the present disclosure will be described below and can be clearly understood by those skilled in the art from the following description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ILLUSTRATED EMBODIMENTS

Figure 1:
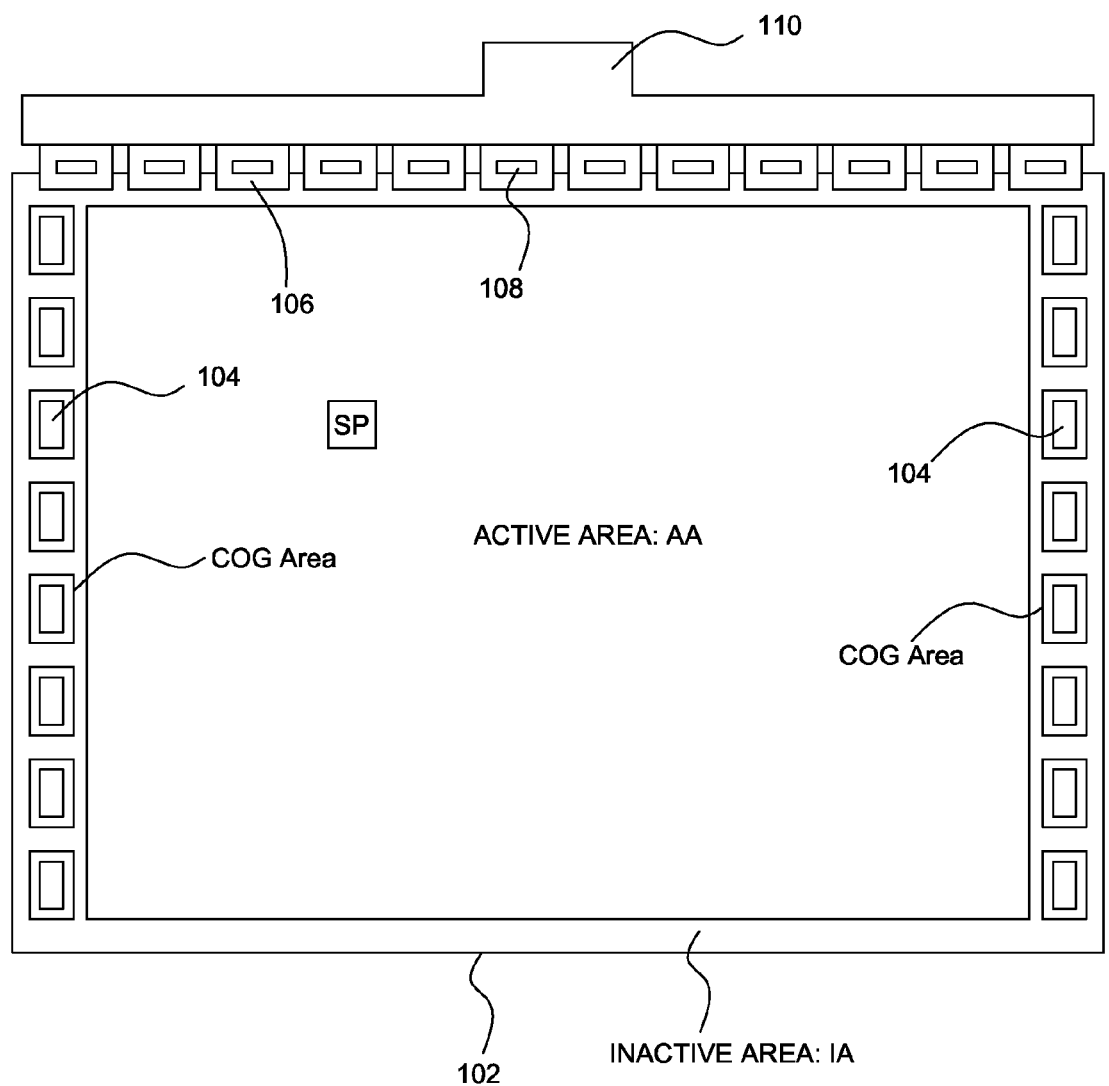
FIG. 1 is a schematic illustration of a display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure.

Features described in reference to certain embodiments of the present disclosure are not to be restricted to the specific embodiments, and may be included in various other embodiments of the present disclosure without departing from the scope of the present invention. The scope of the subject matter contained in the present disclosure is not to be restricted, therefore, to the specific embodiments, and it is intended that the appended claims cover any and all such applications, modifications, and embodiments within the scope of the present disclosure.

Hereinafter, exemplary embodiments of the present disclosure will be described in detail with reference to the accompanying drawings.

FIG. 1 is a schematic illustration of a display device according to an exemplary embodiment of the present disclosure. In FIG. 1, the display device 100 is described with reference to a liquid crystal display device. However, it should be noted that the display device 100 is not particularly limited as such, and the display device 100 may employ various other types of displays, including but not limited to an organic light emitting display, an electrophoretic display and the like. Any type of display can be used as long as an active area (i.e., display area where the pixels are located) of the display is divided into a plurality of blocks, in which each block is configured to receive a signal from a different drive integrated circuit.

If the display device 100 is configured as a liquid crystal display device, it can be realized as a TN (Twisted Nematic) structure, a VA (Vertical Alignment) structure, an IPS (In Plane Switching) structure, an FFS (Fringe Field Switching) mode or an ECB (Electrically Controlled Birefringence) structure. If the display device 100 is configured as an organic light emitting display device, it can be realized as a top-emission structure, a bottom-emission structure, or a dual-emission structure.

The display device 100 includes an active area AA and an inactive area IA. A plurality of sub-pixels SP is provided in the active area AA to display images from the display device 100. Each sub-pixel SP is provided with a pixel circuit. The pixel circuit is provided with a transistor connected with a gate line GL and a data line DL as well as a capacitor configured to store a data signal DATA supplied through the transistor in the form of a data voltage, and controls the corresponding sub-pixel SP based on the data voltage stored in the capacitor. Additional thin-film transistors and capacitors may be used to implement the pixel circuit. The number of TFTs and capacitors as well as their interconnections in implementing the pixel circuit can vary depending on the type, the structure and/or the drive mode of the display device 100.

The display device 100 includes a gate driving unit and a data driving unit, and displays an image by driving the plurality of sub-pixels SP in response to a gate signal supplied from the gate driving unit and a data signal supplied from the data driving unit. At least one of the gate driving unit and the data driving unit is provided in the peripheral inactive area IA of the substrate 102 in a form of integrated circuits (IC). As such, the gate driving unit may be implemented with a plurality of drive integrated circuits (D-ICs). Similarly, the data driving unit may be implemented with a plurality of D-ICs.

In the exemplary embodiment illustrated in FIG. 1, the gate driving unit is provided in a chip-on-glass (COG) manner. That is, the gate driving unit is implemented with a plurality of gate drive ICs 104, which are mounted directly on the substrate 102. In this regard, a plurality of COG areas is provided in the peripheral inactive areas IA of the substrate 102, and a single gate drive IC chip is placed in each of the COG areas.

In the structure where the gate drive ICs 104 are mounted on the substrate 102 by bonding, the plurality of COG areas for mounting the gate drive ICs 104 are formed on one inactive area IA or both inactive areas IA of the substrate 102. In each of the COG areas, a plurality of input pads configured to input an external signal to the gate drive IC 104 and a plurality of output pads configured to output a signal from the gate drive IC 104 are disposed. The input pads and the output pads are electrically connected with a bump of the gate drive IC 104 and thus input an external signal to the gate drive IC 104 and output a signal from the gate drive IC 104. Herein, an adhesive such as an anisotropic conductive film (ACF), and a non-conductive paste are disposed between the COG area including the input pads/output pads and the gate drive IC 104, so that the gate drive IC 104 is bonded to and thus electrically connected with the COG area.

Unlike the gate driving unit, the data driving unit is implemented with a plurality of data drive ICs 108 provided in a chip-on-film (COF) manner. The data drive ICs 108 are not directly bonded to the substrate 102, but they are provided on a separate flexible printed circuit board (film) 106, which is connected at an edge of the substrate 102. One side of the flexible printed circuit board 106 can be connected to the substrate 102 and the opposite side of the flexible printed circuit board 106 can be connected with a separate printed circuit board 110 on which a timing control unit and a power supply unit are disposed. Thus, the substrate 102 and the printed circuit board 110 are electrically connected by the flexible printed circuit board 106 to transfer signals therebetween. For instance, the D-ICs provided on the flexible printed circuit board 106 may be configured to receive various D-IC control signals and power signals from the timing control unit and the power supply unit on the printed circuit board 110 via conductive wirings provided on the flexible printed circuit board 106. An image processing unit may be mounted in the form of an integrated circuit (IC) on the printed circuit board 110 or another circuit board (or a system board), but illustration thereof will be omitted herein.

In the present specification, although the gate drive IC 104 is described as being mounted in a COG manner by bonding, the substrate 102 is not limited to a glass substrate. In exemplary embodiments of the present disclosure, the substrate 102 of the display device 100 may be formed of various plastic materials such as PI (polyimide), PC (polycarbonate), PNB (polynorbornene), PET (polyethylene terephthalate), PEN (polyethylenapthanate), and PES (polyethersulfone), and driving units (for example, a gate drive IC, a data drive IC) of the display device 100 may be directly bonded to and mounted on an inactive area of the plastic substrate.

The configuration of the display device 100 described above with reference to FIG. 1 is provided only for understanding of the present disclosure, but a configuration and alignment of the display device 100 and various signals and a power used for driving the display device 100 according to the present disclosure are not limited thereto. For example, the data drive IC 108 of the data driving unit can also be provided in a COG manner by being directly bonded to one or both of the inactive areas of the substrate 102. In this case, the output pads positioned in each COG area on which the data drive IC 108 is mounted are connected with the data line DL through a link line and thus supply a data signal to the sub-pixels SP in the active area AA.

Further, the display device 100 may include a driving unit directly formed on the inactive area IA in addition to the driving units mounted on the inactive area IA by bonding. For example, if the data driving unit of the display device 100 is mounted in a COG manner by being directly bonded to the inactive area IA of the substrate 102, the gate driving unit may be provided in a gate-in-panel (GIP) manner on the inactive area IA of the substrate 102.

Figure 2:
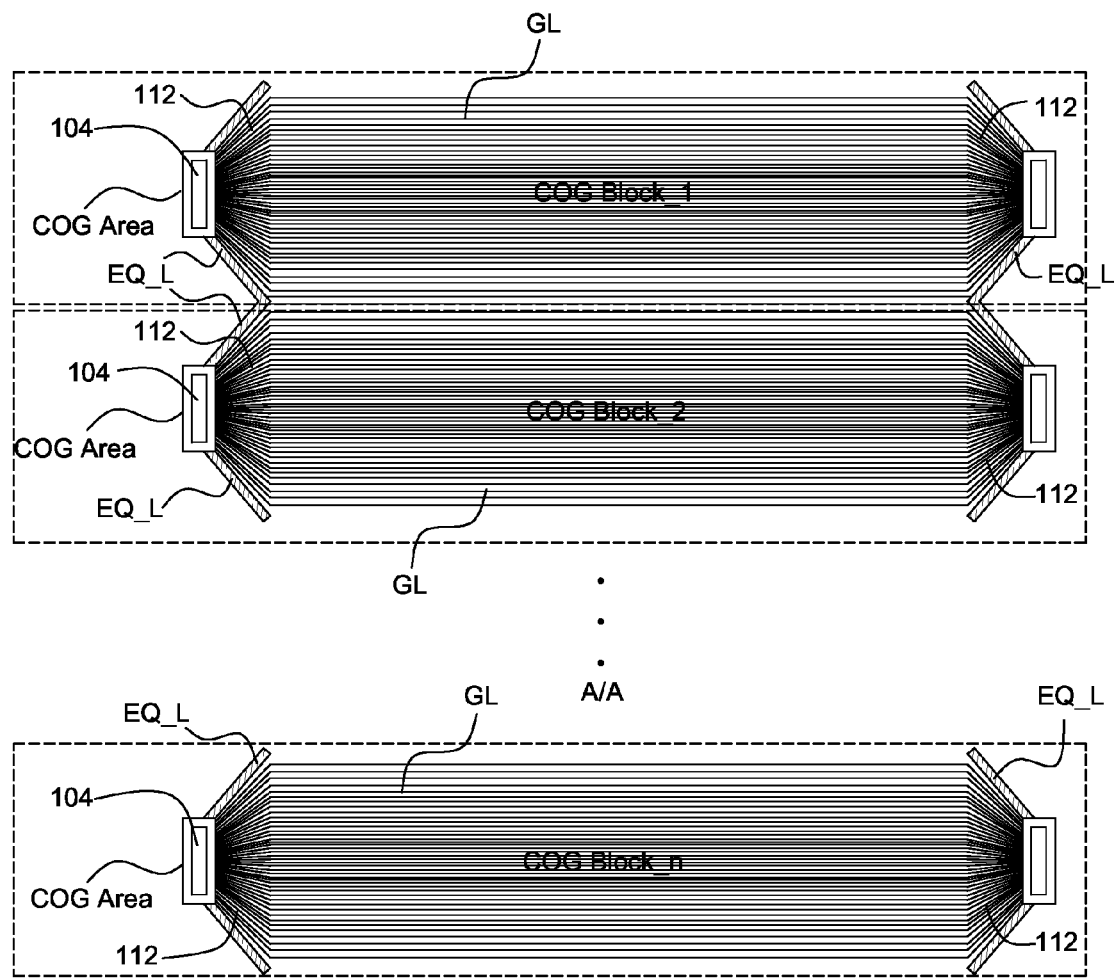
FIG. 2 illustrates an exemplary configuration of COG blocks in a display device for creating equipotential between the COG blocks, according to an embodiment of the present disclosure.

The active area AA of the display device 100 according to the present disclosure includes at least two COG blocks, each having a discrete set of sub-pixels. As shown in FIG. 2, each COG block includes a group of signal lines, which are extended from a discrete set of drive ICs, and sub pixels connected to the group of signal lines. In other words, the sub-pixels of the first COG block receive signals from the first set of drive ICs via the first set of signal lines. The sub-pixels of the second COG block receive signals from the second set of drive IC via the second set of signal lines.

For example, a COG block can be formed of gate lines connected to a gate drive IC 104 mounted in a COG area. In embodiments provided with data drive ICs directly mounted on the substrate 102 in the COG manner, the COG block can be formed of data lines connected to a data drive IC 108 mounted in a COG area. In embodiments with the COG areas positioned on two opposite ends of the substrate 102, a single COG block can include signal lines extended from two COG areas positioned at the opposite ends of the substrate 102.

As described above, electrostatic charges generated or introduced during various processes performed while the display device 100 is manufactured may be trapped in various organic-inorganic films of the display device 100. The electrostatic charges generated or introduced during the processes make a difference in loading effect between the COG blocks. The inventors of the present disclosure recognized that while a plasma process and a dry etching process or other processes are performed to improve characteristics of a transistor, a difference in loading effect between the COG blocks results in non-uniformity in plasma density. Further, a negative shift of a threshold voltage of transistors between the COG blocks causes various display problems. However, the display device 100 according to the present disclosure has a structure in which an equipotential can be formed between the COG blocks in the active area AA during a manufacturing process thereof. Therefore, it is possible to reduce a difference in loading effect between the COG blocks during a manufacturing process of the display device 100 and thus possible to minimize a difference in electrical characteristic between transistors constituting pixel circuits of the final display device 100.

FIG. 2 illustrates an exemplary display device having a plurality of COG blocks and equipotential line for forming equipotential between the COG blocks. A plurality of gate lines GL is provided across the active area AA of the display device 100. Each gate line GL is configured to apply a gate signal to control on/off of a transistor for driving the sub-pixels SP in the active area AA. Accordingly, the sub-pixels SP in the active area AA are controlled by the gate signal from the gate drive IC 104. As shown in FIG. 2, the active area AA includes a plurality of COG blocks (COG Block_1, COG Block_2, . . . COG Block_n). In this example, COG areas are provided along two opposite sides of the display device, in which a gate drive IC 104 is mounted in each of the COG areas. Link lines 112 extended from each of the COG areas can be connected to the gate lines GL.

In FIG. 2, each COG block includes gate lines GL configured to be applied with gate signals from a pair of gate drive ICs 104 mounted in COG blocks positioned at the opposite ends. In some other exemplary embodiments, however, each COG block may be defined with a set of gate lines extending from a single COG area.

Accordingly, the sub-pixels SP of different COG blocks receive gate signals from a different gate drive IC 104 (or a different set of gate drive ICs 104) from each other. However, the equipotential line EQ_L extended between the COG blocks (COG Block_1, COG Block_2 to COG Block_n) temporarily creates equipotential between the COG blocks. That is, in a structure divided into COG blocks each driven by an individual gate drive IC 104 or an individual group of gate drive ICs 104, equipotential is formed throughout the COG blocks and the gate lines of those COG blocks by electrically connecting the COG blocks. Thus, electrical charges and/or electrostatic charges generated during manufacturing of the display device are distributed throughout the COG blocks, affecting all of the TFTs in the array. Since all of the COG blocks are affected similarly by the electrostatic charges or the trapped electrical charge, the deviation between the electrical properties of the TFTs in different COG blocks are minimized.

Prior to performing a test, such as an ART test or an AP test, which requires applying different signals to the respective COG blocks or the gate lines GL in each COG block, the equipotential line EQ_L that created the equipotential between the COG blocks is cut. After cutting the equipotential line, the test or another subsequent manufacturing process are carried out.

In order to temporarily short-circuit the link lines 112 and the gate lines GL extended from the output pads in each COG area, the output pads are connected with a shorting bar. In the present specification, a connection part configured to connect the shorting bar with the pads and a connection part configured to connect the shorting bar with the equipotential line EQ_L in the COG area may be referred to as shorting lines. The shorting line between the shorting bar and the equipotential line EQ_L configured to form an equipotential between the COG blocks may be cut at the same time during the process cutting the shorting lines between the output pads and the shorting bar in each COG area.

Figure 3:
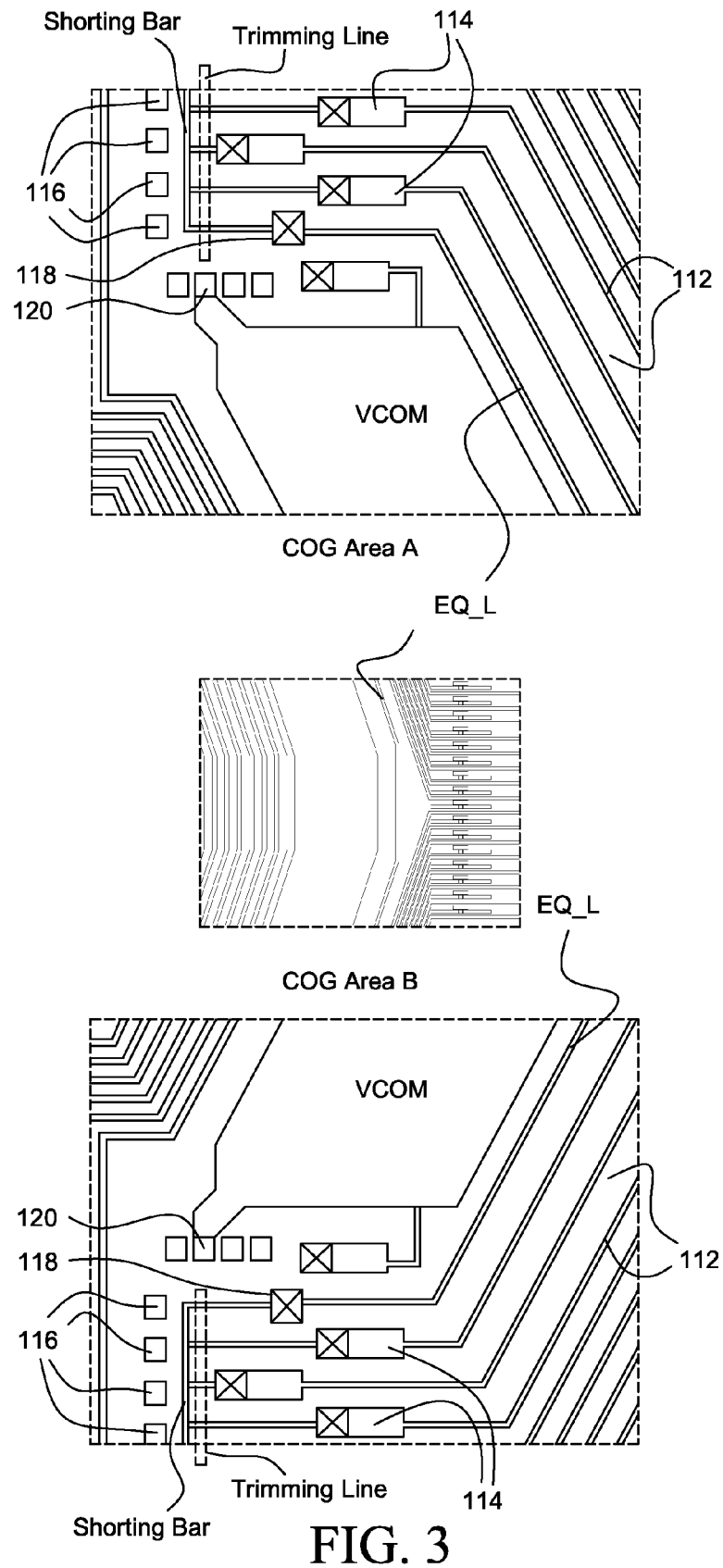
FIG. 3 is a schematic illustration showing an enlarged view of an exemplary configuration in COG areas of two different COG blocks for creating equipotential between the COG blocks in a display device, according to an embodiment of the present disclosure.

FIG. 3 is a diagram illustrating the display device 100 in a state where the equipotential line EQ_L extended between two COG areas COG Area_A and COG Area_B disposed in one inactive area of the display device 100 is formed in order to temporarily form equipotential between the COG blocks according to an exemplary embodiment of the present disclosure.

In the first COG area COG Area_A and the second COG area COG Area_B, output pads 114 are connected with the link lines 112. The link line 112 is connected with the gate line GL configured to apply a signal to control on/off of a transistor in the sub-pixels SP. As described above, the sub-pixels SP positioned in each of the COG blocks (COG Block_1, COG Block_2, . . . COG Block_n) are driven by applying a gate signal output from a specific gate drive IC 104 or a combination of specific gate drive ICs 104. Accordingly, when the gate drive IC 104 is mounted in each of the COG areas COG Area_A and COG Area_B, the gate signals from the gate drive IC 104 are supplied to the transistors in the sub-pixels SP via the output pads 114, the link line 112, and the gate lines GL.

During various manufacturing or testing processes performed while the display device 100 including such COG-type driving units is manufactured, static electricity ESD may be introduced into the display device 100. For example, the static electricity ESD may be introduced during various manufacturing and inspection processes such as transferring the substrate 102 or forming the transistors on the substrate 102. If the static electricity ESD is introduced into various lines of the display device 100, a short circuit or disconnection may occur in the pads or link lines 112 placed closely next to each other, which may eventually result in display defects in the display device 100. Further, when even applying the same signal to all the gate lines or the output pads in the COG areas to check for defects in of the display device 100, the link line 112 is highly likely to be damaged due to the existing potential difference between the link lines 112. Therefore, a shorting bar is provided in each of the COG areas to temporarily short-circuit the output pads 114 and the link lines 112 extended from the output pads 114 in the respective COG area.

In each COG area, a shorting bar is placed between an input pad area, where a plurality of input pads 116 is disposed, and an output pad area, where a plurality of output pads 114 is disposed. For instance, the plurality of output pads 114 and the plurality of input pads 116 may be linearly arranged in an output pad area and an input pad area, respectively, within each COG area, and the shorting bar may be positioned between the output pad area and the input pad area as depicted in FIG. 3.

By using the shorting bar as illustrated in FIG. 3, an equipotential is temporarily formed among the output pad 114, the link lines 112, and the gate lines GL in each COG block. Even with the shorting bar provided in each of the COG areas, however, potential difference may still exist between the COG blocks. Accordingly, the display device 100 according to the present disclosure is further equipped with one equipotential line EQ_L for temporarily creating equipotential between the COG blocks.

In the example shown in FIG. 3, the equipotential line EQ_L is extended between the two adjacent COG areas, and the equipotential line EQ_L is in contact with the shorting bar in each of the two COG areas. In other words, the equipotential line EQ_L is extended between the first COG area COG Area_A and the second COG area COG Area_B so as to connect a shorting bar in the first COG area COG Area_A with a shorting bar in the second COG area COG Area_B. While the display device 100 being manufactured, as the shorting bar in the first COG area COG Area_A is connected with the shorting bar in the second COG area COG Area_B, an equipotential is formed between a first COG block defined by a conductive path of the first COG area COG Area_A and a second COG block defined by a conductive path of the second COG area COG Area_B. To be more specific, all of the gate lines GL of the first COG block connected with the shorting bar in the first COG area COG Area_A and the gate lines GL of the second COG block connected with the shorting bar in the second COG area COG Area_B are electrically connected by the equipotential line EQ_L so that equipotential is formed between them.

The above-described equipotential line EQ_L may be a dummy line, which becomes a floating state after the manufacturing process of the display device 100 is completed. As illustrated in FIG. 3, the equipotential line EQ_L extending between the COG areas (COG Area_A and COG Area_B) may be routed inwards towards the active area AA of the display device 100. From the shorting bar in the COG area, the equipotential line EQ_L can be extended towards the link area where the link lines 112 connecting the output pads 114 and the gate lines GL are positioned. In this case, the equipotential line EQ_L includes a portion extending in parallel with the link lines 112 in the link area and a portion extending in parallel with the shorting lines connecting the output pads 114 and the shorting bar in each of the COG areas COG Area_A and COG Area_B. Since the equipotential line EQ_L is disposed toward the second COG area COG Area_B by routing the equipotential line EQ_L from the first COG area COG Area_A toward the link area, it will be easier to cut/remove a part of an edge of the equipotential line EQ_L in contact with the shorting bar in each of the COG areas COG Area_A and COG Area_B.

The equipotential line EQ_L may be configured to be in contact with a part of various pads positioned in each of the COG areas COG Area_A and COG Area_B. That is, the equipotential line EQ_L may include a shorting line which is in contact with at least one pad in each of COG areas COG Area_A and COG Area_B and extended from the pad to the shorting bar. Herein, the pad in contact with the equipotential line EQ_L may be one of the plurality of output pads 114, input pads 116, or dummy pads 118 included in the corresponding COG area COG Area_A or COG Area_B.

Figure 4A:
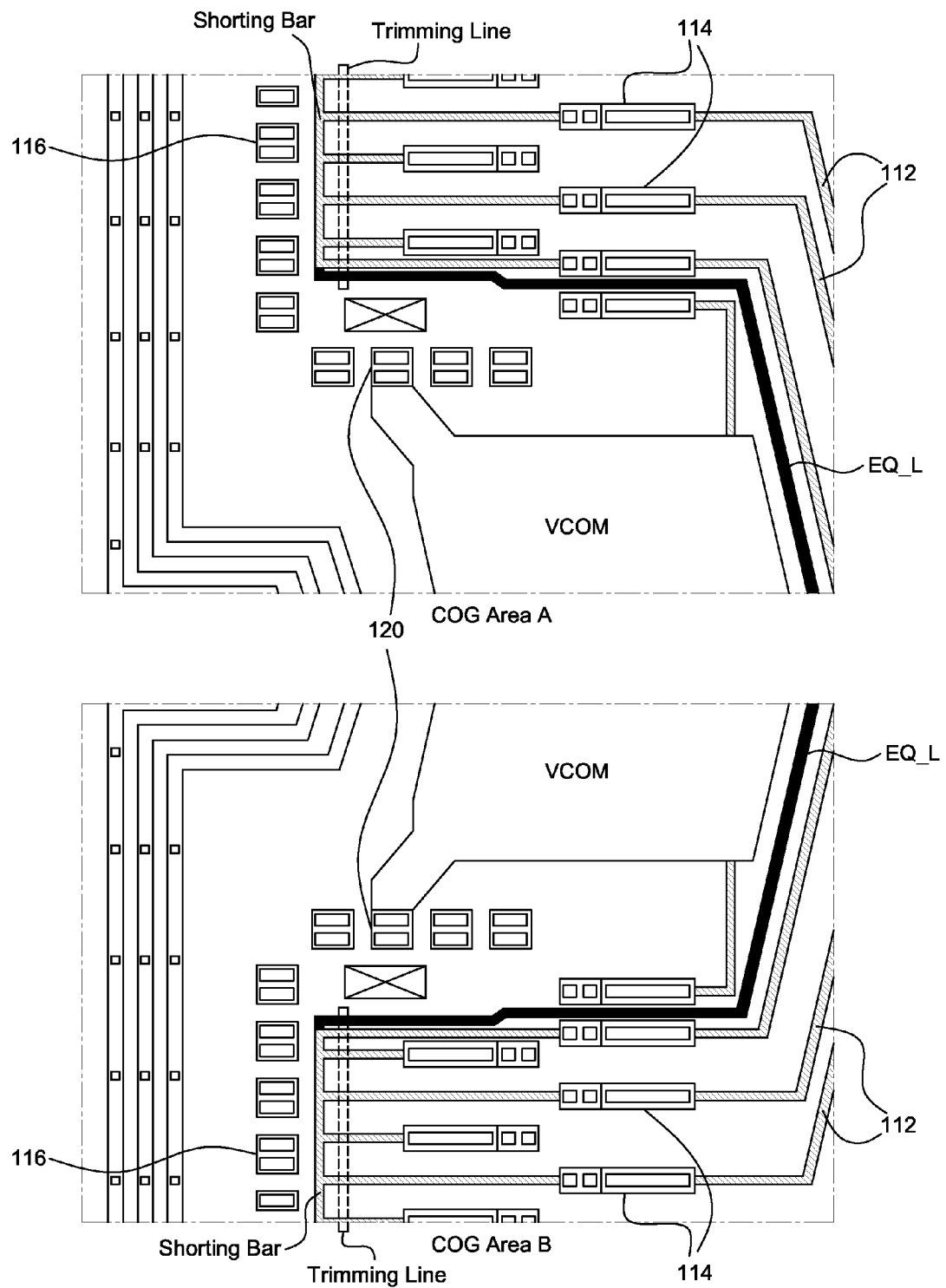
FIGS. 4A and 4B illustrate an exemplary configuration of COG areas of two distinct COG blocks for temporarily forming equipotential between the COG blocks during manufacturing of a display device, according to an exemplary embodiment of the present disclosure.

In an exemplary embodiment illustrated in FIG. 3, the ends of the equipotential line EQ_L extended between the first COG area COG Area_A and the second COG area COG Area_B are in contact with the dummy pads 118 in each of the COG areas COG Area_A and COG Area_B, and the dummy pads 118 in contact with the equipotential line EQ_L are configured to be in contact with the shorting bar via a shorting line. The dummy pads 118 in the COG areas are not connected to the gate lines. It should be noted that the equipotential line EQ_L need not be connected to the dummy pads 118, and the equipotential line EQ_L may be in contact with the shorting bar without being connected through the dummy pads 118 as shown in FIG. 4A. In the embodiments having the equipotential line EQ_L routed towards the link area, the equipotential line EQ_L can be directly connected to the shorting bar so long as the part of the equipotential line EQ_L is arranged to extend across the trimming line.

At some point before finishing the manufacture of the display device 100, the gate lines GL of each of the COG blocks need to be electrically isolated. For example, in order to perform a test such as an array test (AR test) or an AP test, signals need to be applied to the gate lines GL in sequential order. Even when ignoring such tests, gate signals are supplied to the gate lines GL in a sequential order to operate the TFT array to output an image on the display device 100. Thus, in each of the COG blocks, the gate lines GL must be disconnected from the shorting bar in the COG area of the respective COG block.

Figure 4B:
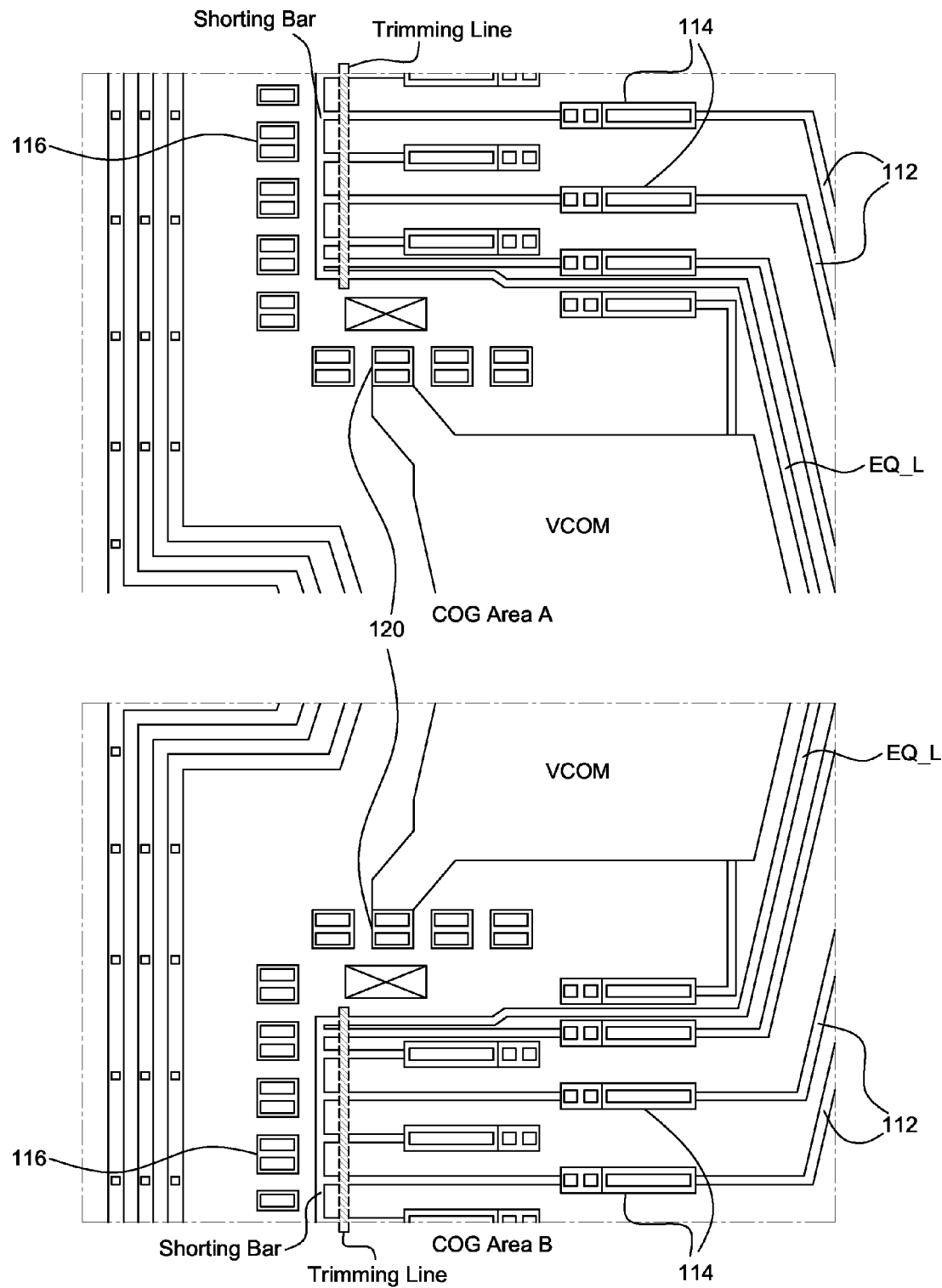

Referring to FIG. 4B, the shorting lines extended between each of the output pads 114 and the shorting bar are cut along a trimming line. That is, for each of the shorting lines between the output pads 114 and the shorting bar, a portion that corresponds to the trimming line is removed. To this end, a trimming process using irradiation of a laser or various physical scribing processes can be performed along the trimming line. Thus, the equipotential between the link lines 112 extended from the respective output pads 114 and further between the gate lines GL extended from the respective link lines 112 can no longer be maintained. As a result, it is possible to apply signals to the respective gate lines GL individually.

It should be appreciated that cutting the shorting lines between the shorting bar and the output pads in the COG areas will break not only the equipotential between gate lines of the respective COG block but also the equipotential between the COG blocks. That is, the equipotential no longer exists between the COG blocks even if the equipotential line EQ_L remains in contact with the shorting bars of the COG areas. However, the equipotential line EQ_L remains in contact with the shorting bar in the COG area may cause unintended electrical issues. For instance, the shorting bar may be electrically connected with some pads or shorting lines by the conductive adhesive (e.g., ACF) used in mounting the gate drive IC 104 in the COG area and disrupt stable operation of the display device 100. Accordingly, it is preferred that the shorting bar in each of the COG areas is disconnected from the equipotential line EQ_L.

When cutting the shorting lines between the shorting bar and the output pads 114, the shorting line extended between the equipotential line EQ_L and the shorting bar for creating equipotential between the COG blocks may also be cut along the trimming line. Likewise, the equipotential line EQ_L crossing the trimming line towards the shorting bar may be cut along the trimming line.

Herein, a removal of a part of the equipotential line EQ_L or a part of the shorting line connecting the equipotential line EQ_L with the shorting bar can be performed at the same time as a removal of a part of the shorting lines configured to connect the output pads and the shorting bar in each COG area. That is, the equipotential line EQ_L or the shorting line positioned between the equipotential line EQ_L and the shorting bar can be cut in the same manner as the shorting lines between the output pads 114 and the shorting bar are cut along the trimming line in the COG area.

In order to make it easier for cutting the shorting line between the equipotential line EQ_L to the shorting bar together with the shorting lines between the output pads 114 and the shorting bar, the shorting line configured to connect the equipotential line EQ_L with the shorting bar may be disposed across a trimming line or a trimming area where the shorting lines between the output pads 114 and the shorting bar are removed.

For example, ends of the equipotential line EQ_L extending toward the shorting bars in the first COG area COG Area_A and the second COG area COG Area_B are routed cross the trimming line in each of the first COG area COG Area_A and the second COG area COG Area_B. In this way, a single trimming process along the trimming line can cut the shorting lines between the output pads and the shorting bar as well as the shorting line between the equipotential line EQ_L and the shorting bar.

Further, an end of the equipotential line EQ_L extended to the shorting bar in each COG area may be disposed in parallel with the shorting lines extended between the output pads 114 and the shorting bar. Arranging the end portion of the equipotential line EQ_L or the shorting line between the equipotential line EQ_L and the shorting bar in parallel to the shorting lines between the output pads and the shorting bar as illustrated in FIG. 3 and FIG. 4A, allows to minimize the length of the trimming line with a simple design. Thus, a greater process margin can be provided when performing the trimming process.

If necessary, only a part of the shorting line configured to connect the equipotential line EQ_L with the shorting bar may be removed earlier than the shorting lines configured to connect the output pads 114 with the shorting bar. In this case, an equipotential between each of the COG blocks is not maintained, but an equipotential between the gate lines GL within each COG block can be continuously maintained.

As such, by removing an equipotential between the COG blocks and an equipotential between the gate lines GL in each COG block, a structure capable of applying gate signals to the respective gate lines GL in each COG block may be formed. Then, the gate drive IC 104 is mounted on each COG area, so that a display device 100 including a COG-type gate driving unit is constructed.

As a result, in the manufacturing process of the display device 100, the equipotential is formed between the COG blocks until a part of the shorting lines between the output pads 114 in each COG area and the shorting bar is removed or a part of the shorting line between the equipotential line EQ_L and the shorting bar is removed. With the equipotential formed between the COG blocks, electrostatic can be suppressed when carrying out dry etching processes for patterning various conductive lines and insulating layers on the substrate 102. If necessary, a plasma treatment process may be performed to adjust a carrier concentration of an oxide semiconductor transistor formed on the substrate 102 to improve mobility of a channel. While during the equipotential is maintained between the COG blocks, charges generated or trapped in insulation layers in manufacturing processes will affect all of the COG blocks. Thus, non-uniformity in the electrical properties (e.g., threshold voltage) of the TFTs at different COG blocks of the display device 100 can be minimized.

A test (for example, array test, AP test) in which signals are applied to the respective COG blocks and gate lines GL during the manufacturing process of the display device 100 is performed after an equipotential between the COG blocks is removed. If the test in which signals are applied to the respective COG blocks and gate lines GL is skipped, the trimming process needs to be performed prior to carrying out a process which prevents cutting the shorting lines in each COG area. Thus, a difference in luminance between the COG blocks of the manufactured display device 100 can be reduced. In the completed display device, the equipotential line EQ_L is disposed between the first COG area COG Area_A and the second COG area COG Area_B, and the equipotential line EQ_L is disconnected from the shorting bar by the trimmed portion in the conductive path along the trimming line in each COG area. Accordingly, the gate lines GL of the first COG block are configured to be loaded with the gate signal from the gate drive IC mounted in the first COG area COG Area_A and the gate lines GL of the second COG block are configured to be loaded with the gate signal from the gate drive IC mounted in the second COG area.

In some exemplary embodiments of the present disclosure, the equipotential line for temporarily creating equipotential between COG blocks during manufacturing of the display device 100 may serve as an external signal line for supplying an external input signal or as a power line for supplying power signal. For example, the equipotential line EQ_L may be formed of one of lines routed to a signal line area positioned at the periphery of the display device 100. Since a conductive line with a lower resistance is more advantageous in creating equipotential between COG blocks, the equipotential line EQ_L may serve as an external signal line or a power line, which is wider and/or thicker than other external signal/power lines.

Figure 5A:
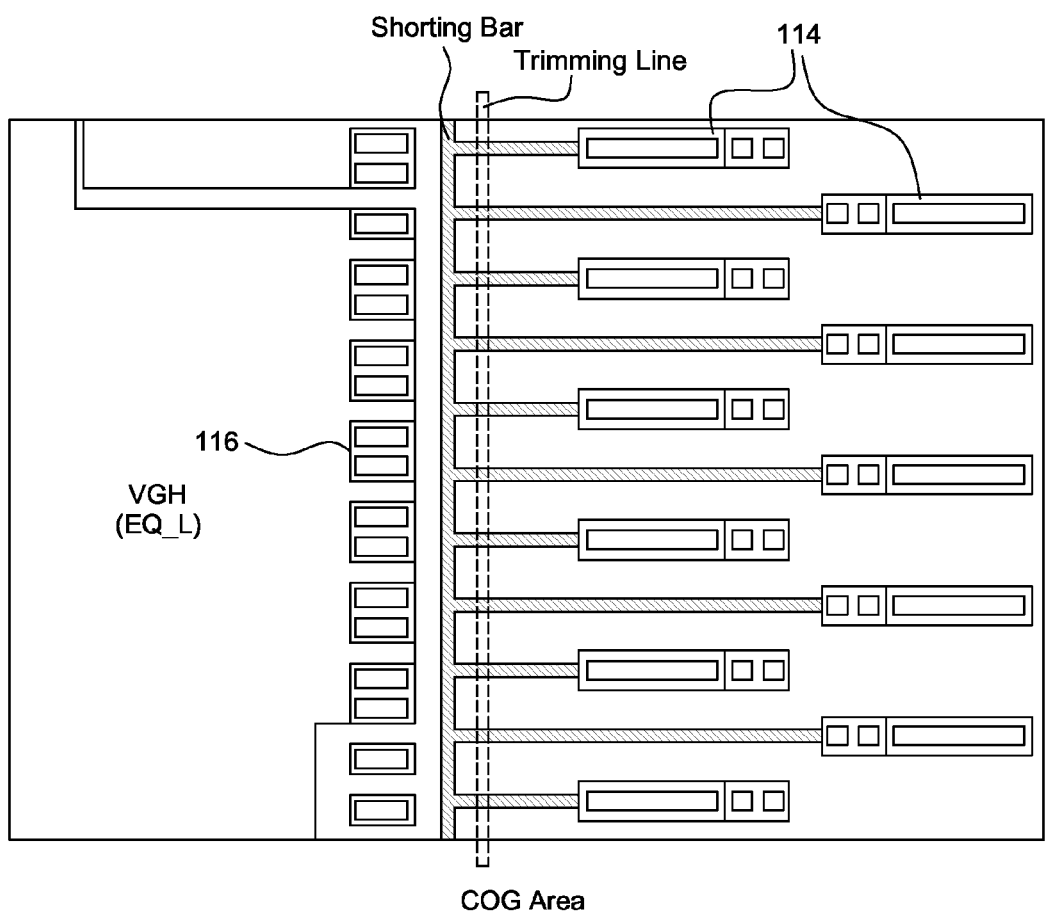
FIGS. 5A and 5B illustrate an exemplary configuration of COG areas of two distinct COG blocks for temporarily forming equipotential between the COG blocks during manufacturing of a display device, according to an exemplary embodiment of the present disclosure.

FIG. 5A illustrates the display device 100 in which the equipotential line EQ_L is used as the VGH line VGH_L, according to an exemplary embodiment of the present disclosure. The VGH line VGH_L positioned in the external signal line area is configured to supply a VGH voltage to each of the COG areas. The VGH line VGH_L can be configured to provide the voltage signal to the drive IC in each of the COG areas in parallel or serially through the COG areas. The VGH line VGH_L is in contact with some of the input pads 116 in the corresponding COG area and then supplies a driving voltage to the gate drive IC 104. In each COG area, the output pads 114 configured to output gate signals to the gate lines GL through the link line 112 are provided, and each of the output pads 114 is connected with the shorting bar through the shoring line, so that an equipotential is temporarily formed between the gate lines GL in each COG block during the manufacturing process of the display device 100.

In the present exemplary embodiment, at least one of the input pads 116 in contact with the VGH line VGH_L is in contact with the shorting bar through the separate shorting line, so that an equipotential is formed between the COG blocks.

In other words, the VGH line VGH_L connects the shorting bars in parallel with the respective COG areas positioned on one side of the inactive area of the substrate 102 or connects the shorting bars in series with each other in each COG area, so that an equipotential is formed between the COG blocks.

In the display device 100 having a structure in which an equipotential is formed between COG blocks by using the external signal line or the voltage line as described in the exemplary embodiment illustrated in FIG. 5A, a part of the shorting lines configured to connect the output pads 114 with the shorting bar is removed along the trimming line. Such removal is performed in order to apply signals to the respective gate lines GL in the active area AA in the same manner as the exemplary embodiments illustrated in FIG. 3 and FIG. 4A-4B. That is, as illustrated in FIG. 5B, the shorting lines between the output pads 114 and the shorting bar are spaced apart from each other as much as a distance of the part removed along the trimming line, causing an equipotential between the link lines 112 extended from the respective output pads 114 and further between the gate lines GL extended from the respective link lines 112 to not be maintained any longer.

Figure 5B:
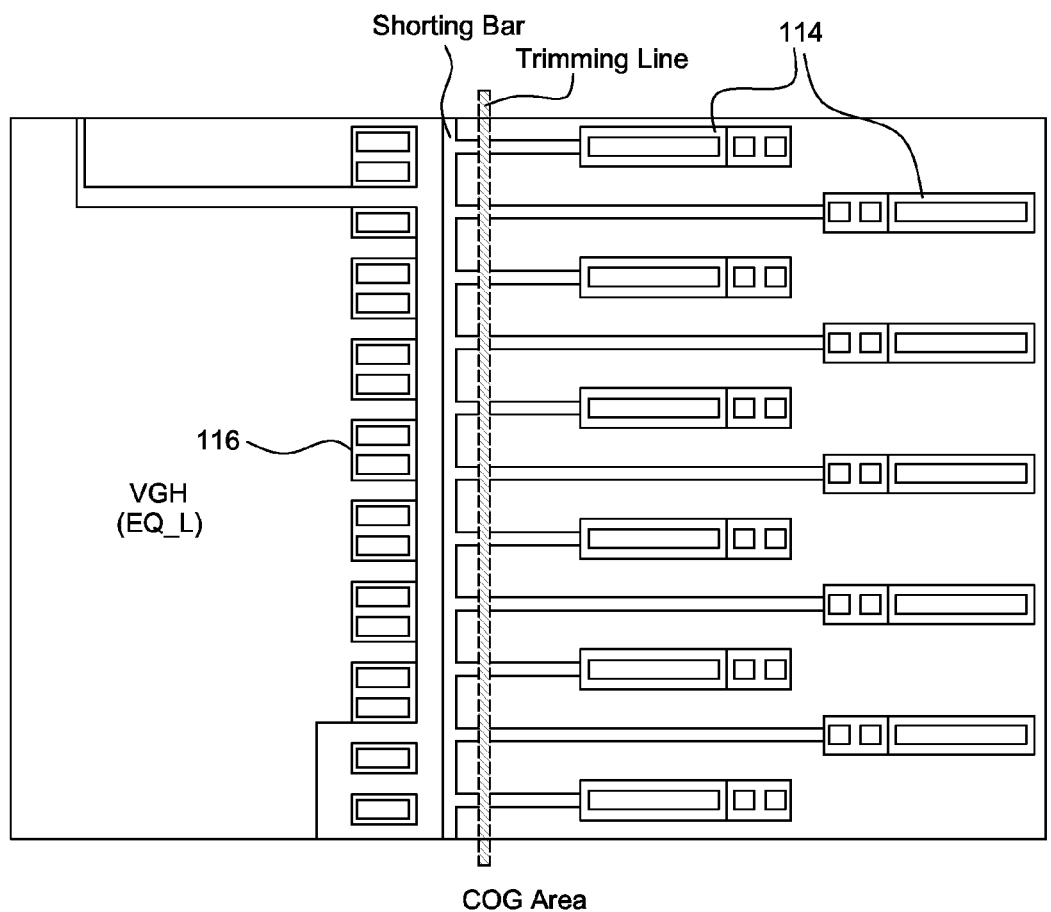

If a trimming process is performed along the trimming line as illustrated in FIG. 5B, the VGH line VGH_L used for forming an equipotential between the COG blocks remains as being in contact with the shorting bar. As described above, even when the equipotential line EQ_L is connected with the shorting bar in the COG area, if a part of the shorting lines configured to connect the output pads 114 in each COG area with the shorting bar is removed, signals can be applied to the respective gate lines GL in the COG blocks. However, the present disclosure is not limited thereto. Even if an equipotential is temporarily formed between the COG blocks by using the external signal line or the voltage line, the shorting line configured to connect the equipotential line EQ_L with the shorting bar may be disconnected from the shorting bar by a trimming process depending on a position and a routing shape of the shorting line.

In the display device 100 according to yet another exemplary embodiment of the present disclosure, a line EQ_L for temporarily forming an equipotential between COG blocks may be a line configured to transfer a specific signal between the COG blocks by remaining to be connected with a specific pad in each COG area.

Figure 6A:
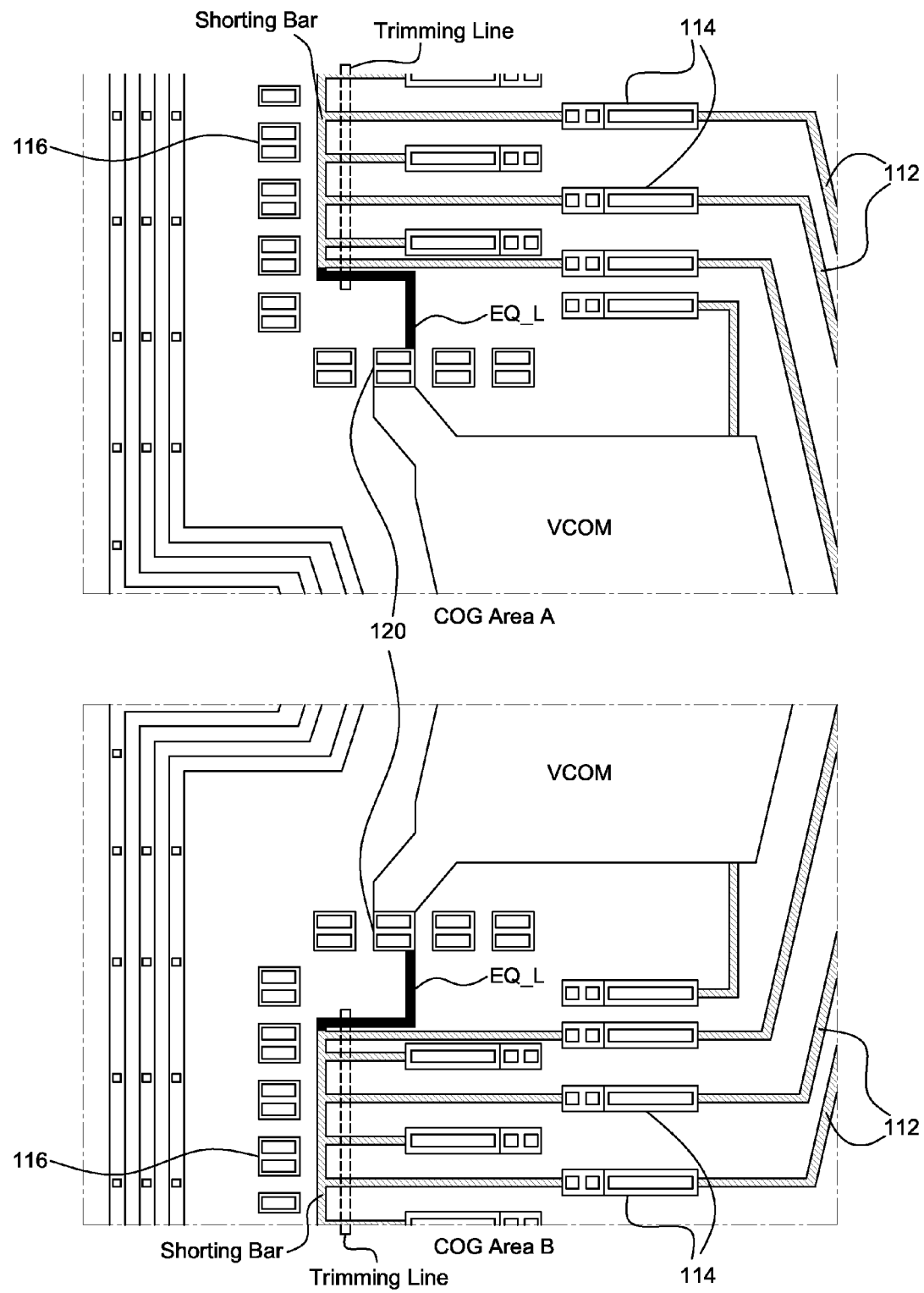
FIGS. 6A and 6B illustrate an exemplary configuration of COG areas of two distinct COG blocks for temporarily forming equipotential between the COG blocks during manufacturing of a display device, according to an exemplary embodiment of the present disclosure.

FIG. 6A is a diagram illustrating a COG area of the display device 100 according to yet another exemplary embodiment of the present disclosure. Referring to FIG. 6A, a VCOM line VCOM_L configured to transfer a common voltage is positioned between the first COG area COG Area_A and the second COG area COG Area_B which are positioned in the inactive area IA on one side of the display device 100 and adjacent to each other. The VCOM line VCOM_L is in contact with a VCOM pad 120 in the first COG area COG Area_A and a VCOM pad 120 in the second COG area COG Area_B. Each of the first COG area COG Area_A and the second COG area COG Area_B includes the shorting bar configured to temporarily form an equipotential between the gate lines GL in each COG block while being in contact with the output pads 114 in each COG area in the same manner as the exemplary embodiments illustrated in FIG. 3 to FIG. 5A. Each of the VCOM pad 120 in the first COG area COG Area_A and the VCOM pad 120 in the second COG area COG Area_B is connected with the shorting bar in each COG area through a shorting line, so that an equipotential is formed between the gate lines GL in the first COG area COG Area_A and the gate lines GL in the second COG area COG Area_B.

Figure 6B:
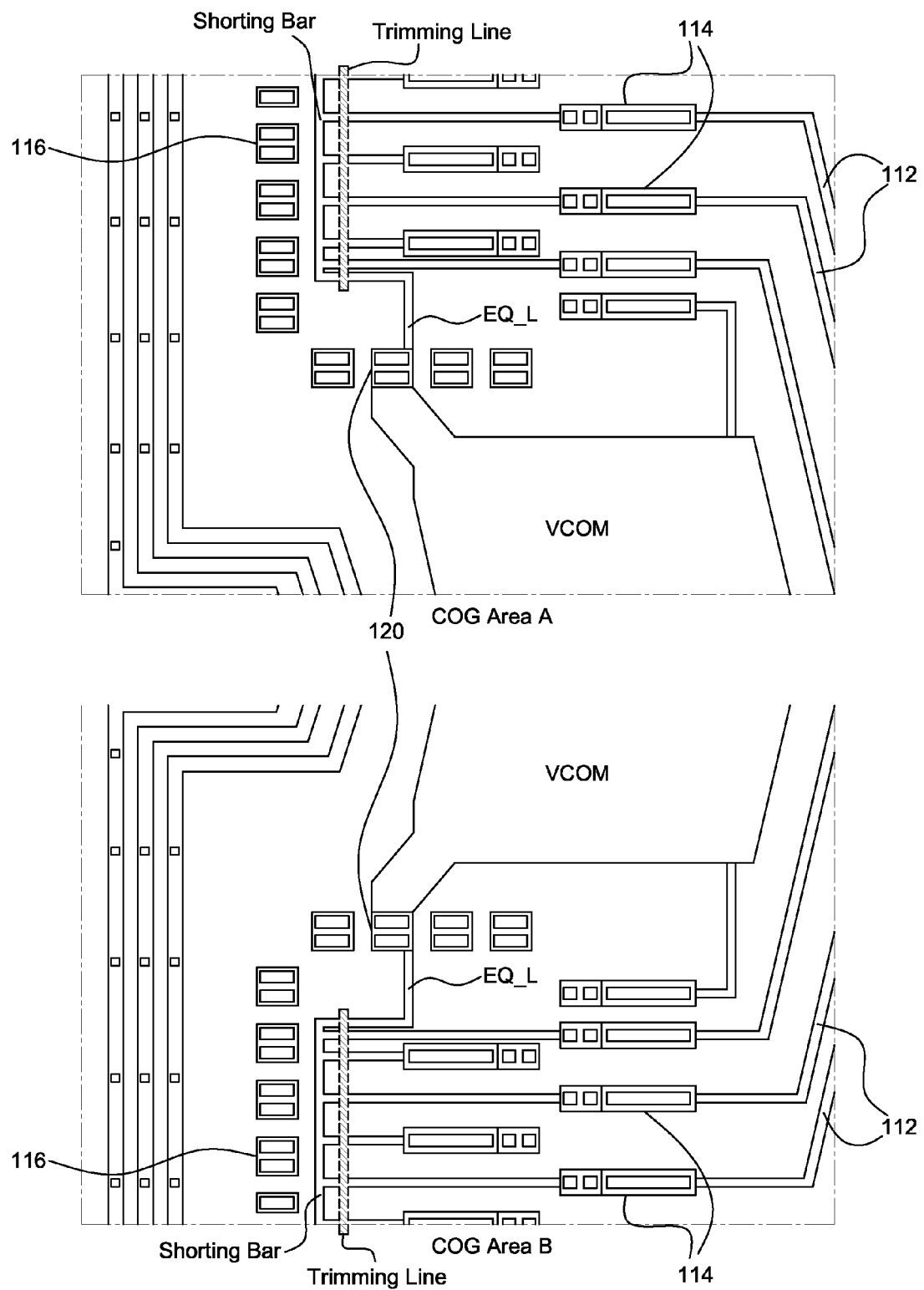

An equipotential is formed between the first COG block including the gate lines GL of the first COG area COG Area_A and the second COG block including the gate lines GL of the second COG area COG Area_B by connecting the VCOM pad 120 connected with the VCOM line VCOM_L in each COG area with the shorting bar. In other words, the VCOM pad 120 in the first COG area COG Area_A and the shorting bar are connected with each other through the shorting line and the VCOM pad 120 in the second COG area COG Area_B and the shorting bar are connected with each other through the shorting line, so that an equipotential is temporarily formed between two COG blocks during a manufacturing process of the display device 100. Then, as illustrated in FIG. 6B, the display device 100 includes the COG blocks configured to receive gate signals from the gate drive ICs 104 mounted on the respective COG areas by performing a trimming process to each COG area. Such trimming process is performed along the trimming line and disconnects the output pads 114 from the shorting bar and the VCOM pad 120 from the shorting bar before applying separate signals to the respective COG blocks or the respective gate lines GL in each COG block.

As illustrated in FIG. 6B, the shorting line extended from the VCOM pad 120 in each COG area so as to be in contact with the shorting bar in the corresponding COG area may be disposed to cross a trimming line for trimming the shorting lines configured to connect the output pads 114 with the shorting bar. Further, the shorting line extended from the VCOM pad 120 in each COG area so as to be in contact with the shorting bar in the corresponding COG area may include a portion arranged in parallel with the shorting lines configured to connect the output pads 114 with the shorting bar. Thus, a trimming line or a trimming area for removing the shorting lines extended toward the shorting bar together with the shorting line between the VCOM line VCOM_L serving as the equipotential line EQ_L and the shorting bar in each COG area can be further simplified in shape. Further, a length of the trimming line in each COG area can be reduced. Thus, when a trimming process is performed, a greater process margin can be supplied.

In the manufacturing process of the display device 100, an equipotential is formed between the COG blocks by the equipotential line EQ_L, and, thus, a difference in loading effect between the COG blocks can be reduced and non-uniformity in plasma density can be reduced. Therefore, a difference in element property such as a difference in threshold voltage of the transistors connected with the sub-pixels SP can be minimized, so that a more stable display device 100 can be provided.

It would be understood by those skilled in the art that various changes and modifications may be made without changing technical conception and essential features of the present disclosure. Thus, it is clear that the above-described embodiments are illustrative in all aspects and do not limit the present disclosure.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A display device, comprising:
    a first chips-on-glass (COG) block including sub-pixels configured to receive output signals from a first drive integrated circuit mounted in a first chips-on-glass (COG) area;
    a second chips-on-glass (COG) block including sub-pixels configured to receive output signals from a second drive integrated circuit mounted in a second chips-on-glass (COG) area;
    an equipotential line extended from the first COG area to the second COG area; and a shorting bar and a set of shorting lines extended from the shorting bar provided in each of the first COG area and the second COG area, wherein each set of shorting lines includes a shorting line that is extended between the equipotential line and the shorting bar of the respective COG area,
    wherein, in each of the first COG area and the second COG area, said shorting line extended between the equipotential line and the shorting bar is cut at a location corresponding to a laser trimmed line so that the equipotential line is electrically insulated from the shorting bar of the first COG area and the shorting bar of the second COG area.

2. The display device according to claim 1, wherein at least some portion of the shorting line extended between the equipotential line and the shorting bar of the respective COG area is parallel to other shorting lines included in the same set of shorting lines provided in the respective COG area.

3. The display device according to claim 2, wherein the equipotential line is in contact with a pad provided in the first COG area and a pad provided in the second COG area.

4. The display device according to claim 3, wherein the pad of the first COG area that is in contact with the equipotential line is electrically disconnected from said shorting line extended between the shorting bar of the first COG area and the equipotential line, and wherein the pad of the second COG area that is in contact with the equipotential line is electrically disconnected from said shorting line extended between the shorting bar of the second COG area and the equipotential line.

5. The display device according to claim 4, wherein the pad of the first COG area and the pad of the second COG area, which are in contact with the equipotential line, are output pads connected to the first drive integrated circuit mounted in the first COG area and the second drive integrated circuit mounted in the second COG area, respectively.

6. The display device according to claim 4, wherein the pad of the first COG area and the pad of the second COG area, which are in contact with the equipotential line, are input pads connected to the first drive integrated circuit mounted in the first COG area and the second drive integrated circuit mounted in the second COG area, respectively.

7. The display device according to claim 4, wherein the pad of the first COG area and the pad of the second COG area, which are in contact with the equipotential line, are dummy pads among the plurality of pads positioned in the first COG area and the second COG area, respectively.

8. The display device according to claim 4, wherein the pad of the first COG area and the pad of the second COG area, which are in contact with the equipotential line, are common electrode pads of the plurality of pads positioned in the first COG area and the second COG area, respectively.

9. The display device according to claim 4, wherein the equipotential line is configured to transfer a common electrode signal between the first COG area and the second COG area.

10. The display device according to claim 4, wherein the equipotential line is configured to supply an external input signal to the first COG area and the second COG area.

11. The display device according to claim 4, wherein the equipotential line is a floating dummy line.

12. A display device, comprising:
a plurality of chips-on-glass (COG) areas positioned along at least one side of a panel, each of the plurality of COG areas having a plurality of pads including one or more input pads and one or more output pads that are connected with a drive integrated circuit, and a shorting bar; and
an equipotential line extended to the plurality of COG areas,
wherein the equipotential line is electrically connected with the shorting bar in each of the plurality of COG areas.

13. The display device according to claim 12, wherein the shorting bar positioned in each of the plurality of COG areas is electrically insulated from the or more output pads positioned in the respective COG areas.

14. The display device according to claim 13, wherein the shorting bar positioned in each of the plurality of COG areas is disconnected from the or more output pads positioned in the respective COG areas by a laser trimmed line, which extends across the shorting lines between the shorting bar and the one or more output pads.

15. The display device according to claim 12, wherein the equipotential line is in contact with one or more pads excluding the one or more output pads among the plurality of pads positioned in the respective COG area.

16. The display device according to claim 15, wherein the equipotential line is in contact with at least one of the input pads positioned in the respective COG area.

17. The display device according to claim 12, wherein the equipotential line is configured to apply an external input signal to the one or more input pads positioned in each of the plurality of COG areas.

18. A display device, comprising:
a plurality of drive integrated circuits discretely mounted in separate ones of a plurality of chips-on-glass (COG) areas, wherein the drive integrated circuit is connected to at least one input pad and at least one output pad provided in a corresponding COG area;
a shorting bar provided in each of the plurality of COG areas, the shorting bar being positioned between the at least one input pad and the at least one output pad of the respective COG area and being disconnected from the at least one output pad by a laser trimmed line; and
an equipotential line routed from one of the plurality of COG areas to at least one other COG area among the plurality of COG areas,
wherein the equipotential line is disconnected from the shorting bar of the COG areas where the equipotential line is routed.

19. The display device according to claim 18, wherein the equipotential line is routed toward a link area of the display device.

20. The display device according to claim 19, wherein the laser trimmed line in each of the COG areas is provided as a straight line, which extends across a part of the equipotential line routed in the respective COG area, so that the equipotential line is spaced apart from the shorting bar of the respective COG area by a width of the laser trimmed line.

21. A method for manufacturing a display device, comprising:
forming a plurality of chips-on-glass (COG) areas and an equipotential line on a substrate, each of the plurality of COG areas having one or more input pads, one or more output pads, a shorting bar and one or more shorting lines connecting the shorting bar with the output pads and the equipotential line; and
performing a laser trimming process along a laser trimming line that runs across said one or more shorting lines, thereby cutting the shorting lines between the shorting bar and the output pads, and the shorting line between the shorting bar and the equipotential line.

* * * * *